(12) United States Patent
Bai

(10) Patent No.: US 7,294,919 B2
(45) Date of Patent: Nov. 13, 2007

(54) DEVICE HAVING A COMPLAINT ELEMENT PRESSED BETWEEN SUBSTRATES

(75) Inventor: Qing Bai, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 459 days.

(21) Appl. No.: 10/723,095

(22) Filed: Nov. 26, 2003

(65) Prior Publication Data
US 2005/0109455 A1    May 26, 2005

(51) Int. Cl.
*H01L 23/48* (2006.01)
*H01R 25/00* (2006.01)

(52) U.S. Cl. ............... 257/688; 257/780; 257/785; 439/66; 439/81; 439/110

(58) Field of Classification Search ............ 257/741, 257/737, 780, 785, 688; 439/66, 81, 110
See application file for complete search history.

(56) References Cited

U.S. PATENT DOCUMENTS

| | | | | |
|---|---|---|---|---|
| 3,967,162 | A * | 6/1976 | Ceresa et al. ............... | 361/751 |
| 4,116,517 | A * | 9/1978 | Selvin et al. ............... | 439/67 |
| 4,769,272 | A | 9/1988 | Byrne et al. | |
| 4,857,668 | A * | 8/1989 | Buonanno .................. | 174/354 |
| 5,142,101 | A * | 8/1992 | Matsuzaki et al. .......... | 174/354 |
| 5,262,347 | A | 11/1993 | Sands | |
| 5,397,857 | A * | 3/1995 | Farquhar et al. ............ | 174/520 |
| 5,474,458 | A * | 12/1995 | Vafi et al. ................. | 439/91 |
| 5,508,228 | A | 4/1996 | Nolan et al. | |
| 5,835,142 | A | 11/1998 | Nakamura et al. | |
| 5,854,514 | A * | 12/1998 | Roldan et al. .............. | 257/746 |
| 5,938,452 | A * | 8/1999 | Wojnarowski ............... | 439/67 |
| 6,005,292 | A * | 12/1999 | Roldan et al. .............. | 257/777 |
| 6,046,410 | A * | 4/2000 | Wojnarowski et al. ...... | 174/262 |
| 6,090,687 | A | 7/2000 | Merchant et al. | |
| 6,092,280 | A * | 7/2000 | Wojnarowski ............... | 29/829 |
| 6,096,413 | A * | 8/2000 | Kalinoski et al. ........... | 428/220 |
| 6,118,181 | A | 9/2000 | Merchant et al. | |
| 6,249,051 | B1 | 6/2001 | Chang et al. | |
| 6,266,872 | B1 * | 7/2001 | Fjelstad .................... | 29/832 |
| 6,358,063 | B1 * | 3/2002 | Neidich .................... | 439/66 |

(Continued)

FOREIGN PATENT DOCUMENTS

| | | |
|---|---|---|
| EP | 0 295 914 | 12/1988 |
| JP | 05243231 | 9/1993 |

OTHER PUBLICATIONS

Larson, et al., U.S. Appl. No. 10/890,343 entitled, "A Film Bulk Acoustic Resonator Package and Method of Fabricating Same," filed Jul. 13, 2004.

*Primary Examiner*—Cathy F. Lam

(57) ABSTRACT

A device comprises a first substrate, a second substrate and a compliant element. The compliant element is composed of a first, compliant material between the first substrate and the second substrate and has a side surface coated at least in part with a layer of a second material. The compliant element exhibits deformation consistent with the first substrate and a second side having been pressed together. In some embodiments, the second material is electrically conductive such that the compliant element provides a reliable electrical connection between the substrates. In other embodiments, the second material increases the hermeticity of the compliant element such that the compliant element provides a better hermetic seal between the substrates.

20 Claims, 10 Drawing Sheets

U.S. PATENT DOCUMENTS

| | | |
|---|---|---|
| 6,365,500 B1 | 4/2002 | Chang et al. |
| 6,451,374 B1 * | 9/2002 | Watchko et al. ............... 427/58 |
| 6,580,159 B1 | 6/2003 | Fusaro et al. |
| 6,713,314 B2 * | 3/2004 | Wong et al. ................... 438/25 |
| 7,005,573 B2 * | 2/2006 | Lionetta et al. ............. 174/387 |

* cited by examiner (Bottom View)

(Top View)

(Bottom View)

DEVICE HAVING A COMPLAINT ELEMENT PRESSED BETWEEN SUBSTRATES

RELATED ART

In manufacturing microfabricated devices, it is common to locate electrical components within a hermetic chamber between two bonded substrates. In some applications, electrical connectivity between two such bonded substrates is desired. For example, electrical components may be formed on both substrates, and electrical connections between the two substrates provide communication between the electrical components. In other examples, electrical connections between two substrates allow components located on one of the substrates to draw electrical power from components located on the other substrate.

Depending on the overall configuration and size of the bonded substrates, it can be difficult to achieve uniform bonding between the substrates. Uneven bonding is particularly prevalent in high profile microfabricated devices (i.e., devices that have a large thickness). Such uneven bonding can cause various manufacturing problems and adversely affect manufacturing yields. For example, hermetic seals can be compromised if two substrates are not tightly bonded over the entire periphery of the seal. In addition, due to uneven bonding, the separation distance between the two substrates may vary. As a result, electrically conductive contacts between the bonded substrates may not be sufficiently pressed together to provide an adequate electrical connection between the substrates.

Commonly-assigned U.S. Pat. No. 6,090,687 describes improved techniques for forming hermetic seals between bonded substrates. As described by the U.S. Pat. No. 6,090,687 a gasket of compliant material is used to form a hermetic seal between two bonded substrates. The compliance of the gasket allows it to deform as the two substrates are pressed together during bonding. Such deformation ensures that the entire periphery of the gasket closely conforms to the contours of both substrates during bonding resulting in a better seal. However, very few materials possess good compliant and hermetic properties, and the few materials that do possess such properties are often expensive or incompatible with many common microfabrication processes.

SUMMARY

Generally, embodiments of the present invention pertain to devices having bonded substrates joined by a compliant contact.

A method for manufacturing a device in accordance with one exemplary embodiment of the present invention comprises: providing a first substrate and a second substrate; forming a compliant element of a compliant first material on the first substrate, the compliant element comprising an end surface and a side surface adjacent the end surface; coating at least a portion of the side surface with a layer of a second material; pressing the second substrate against the end surface of the compliant element, the pressing including deforming the compliant element; and bonding the substrates together.

A device in accordance with one exemplary embodiment of the present invention comprises a first substrate, a second substrate and a compliant element. The compliant element is composed of a first, compliant material between the first substrate and the second substrate and has a side surface coated at least in part with a layer of a second material. The compliant element exhibits deformation consistent with the first substrate and a second side having been pressed together.

In some embodiments, the second material is electrically conductive such that the compliant element provides a reliable, electrical connection between the substrates. In other embodiments, the second material increases the hermeticity of the compliant element such that the compliant element provides a better hermetic seal between the substrates.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION

Embodiments of the present invention generally pertain to improved techniques for providing hermetic seals or electrical connections between bonded substrates. In general, a compliant element (e.g., a gasket or a post) for forming a hermetic seal or an electrically conductive connection between two bonded substrates is formed on one of the substrates. This element is formed of a compliant material, such as polyimide. At least a portion of the compliant element is coated with a material that is selected to increase the electrical conductivity or the hermeticity of the compliant element.

Prior to or during bonding, the compliant element is pressed against another substrate. The compliance of the element allows it to deform and conform to the surface of the substrate. As a result, the element forms a better electrical connection or hermetic seal between the bonded substrates.

Figure 1:
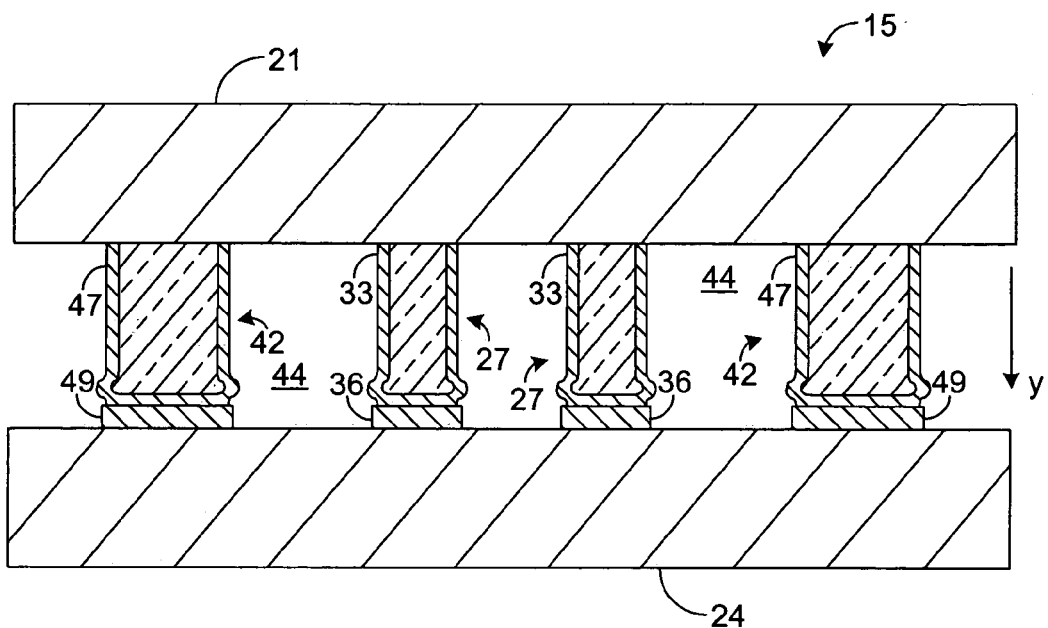
FIG. 1 is a cross-sectional view of a device manufactured in accordance with the present invention.

FIG. 1 depicts a device 15 manufactured in accordance with an exemplary embodiment of the present invention. As shown by FIG. 1, the device 15 has two substrates 21 and 24. In one embodiment, each of the substrates 21 and 24 is composed of silicon. However, the substrates 21 and 24 may be composed of other materials in other embodiments. The device 15 shown by FIG. 1 has two electrically conductive posts 27 that extend between and electrically interconnect the substrates 21 and 24. Opposite ends of each post 27 are respectively pressed against substrates 21 and 24. Other numbers of electrically conductive posts 27 may be used in other embodiments.

Each electrically conductive post 27 is composed of a compliant material, such as polyimide or other type of compliant polymer. Polymers have typically been used in conventional microfabricated devices as the material of stress relief layers or as a bonding material. However, polymers are generally poor conductors and have not previously been used to provide electrical connections between substrates of microfabricated devices.

Each post 27 is coated with a thin layer 33 of an electrically conductive material. As will be described in more detail below, the electrically conductive posts 27 are formed on substrate 21 before the substrates 21 and 24 are bonded together. Electrically conductive pads 36 for contacting the electrically conductive posts 27 are formed on substrate 24. The pads 36 complete the electrical connections between the substrates 21 and 24 by providing a relatively wide, electrically conductive area for each of the posts 27 to contact. The posts 27 may be electrically connected to circuits residing on the substrates 21 and/or 24.

A gasket 42 extends around the periphery of the device 15. Opposite ends of the gasket 42 are respectively pressed against substrates 21 and 24, and the gasket 42 provides a hermetic seal for a chamber 44 within the device 15. The gasket 42 is composed of a compliant material, such as polyimide or other type of compliant polymer. As described above, polymers have typically been used in conventional microfabricated devices as the material of stress relief layers or as a bonding material. However, polymers generally have poor hermetic properties and have not previously been used to form hermetic seals.

The gasket 42 is coated with a thin layer 47 of a material, such as gold, copper, glass, or silicon-nitride, that increases the hermeticity of the gasket 42. In a plane parallel to the major surfaces of substrates 21 and 24, the gasket 42 can be of any shape suitable to accommodate the components that are to be located in chamber 44 (e.g., circle, square, rectangle, etc.). A pad 49 may be formed on the substrate 24 and in contact with the gasket 42 along the gasket's entire periphery.

Figure 2:
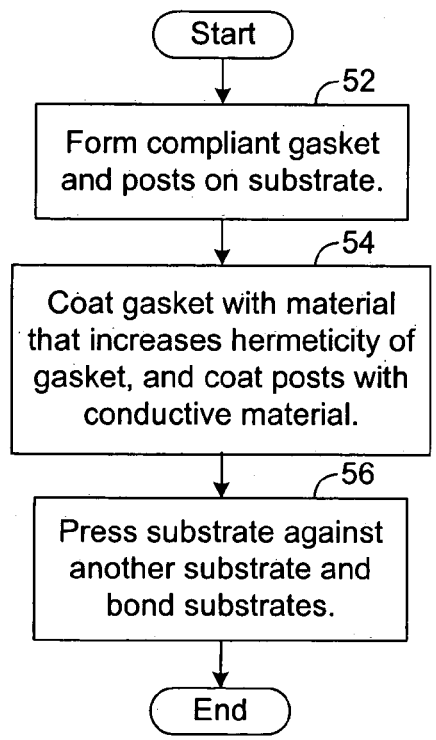
FIG. 2 is flow chart illustrating an exemplary method for manufacturing a device.
Figure 3:
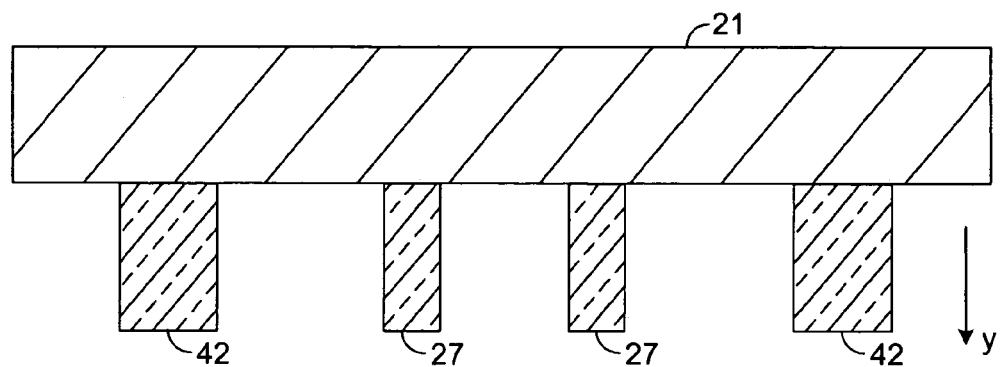
FIG. 3 is a cross-sectional view of a substrate having compliant posts and a compliant gasket formed on a surface of the substrate.
Figure 4:
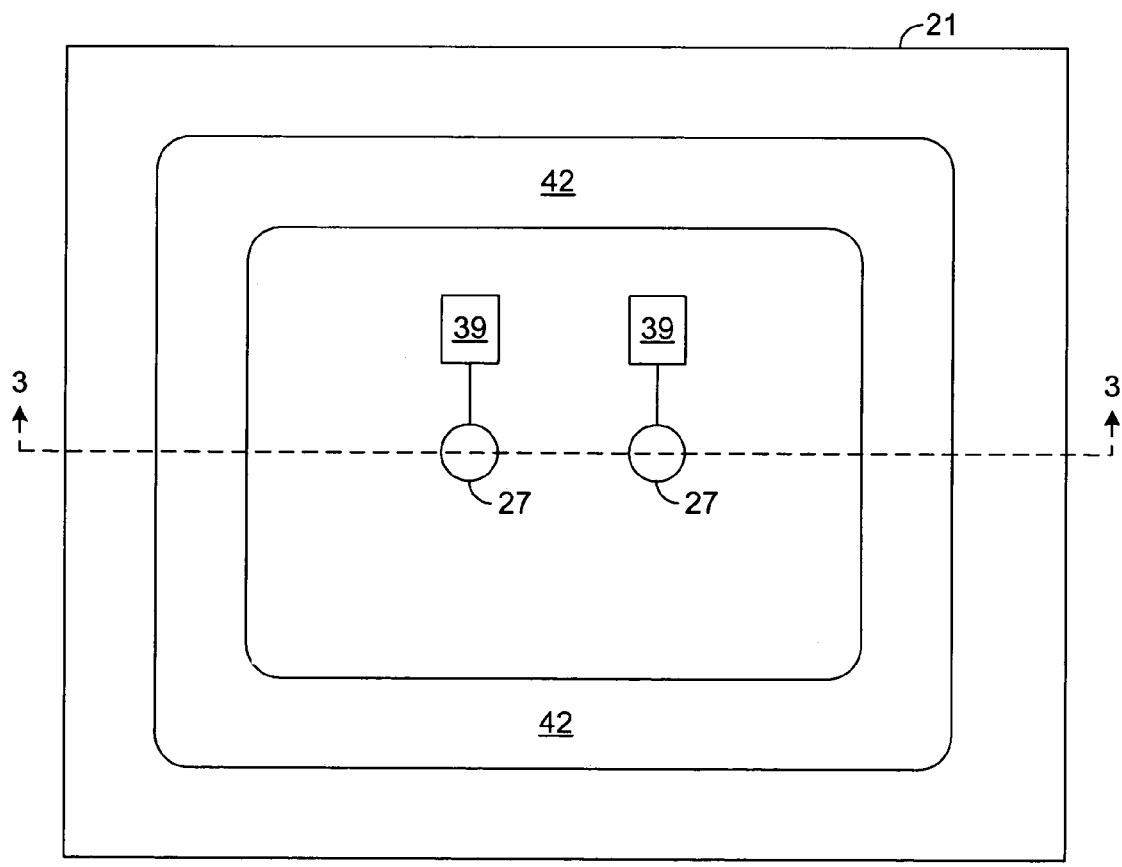
FIG. 4 is a bottom view of the substrate depicted in FIG. 3.

To form the device 15 of FIG. 1, the posts 27 and gasket 42 are initially formed of a compliant material on the major surface of substrate 21, as depicted by block 52 of FIG. 2, as well as FIGS. 3 and 4. Various microfabrication techniques, such as photolithography, etching, and thermocuring, may be used to form the posts 27 and gasket 42. In one exemplary embodiment, the posts 27 and gasket 42 are formed by depositing a layer of polyimide material on the substrate 21. The posts 27 and gasket 42 are then formed using photolithography, etching, and thermocuring. In FIG. 4, the posts 27 are shown as having a generally circular cross-sectional shape in a plane parallel to the major surface of substrate 21. However, the gasket 42 and posts 27 may have other cross-sectional shapes in other embodiments. Furthermore, as shown by FIG. 4, circuits 39 may be formed on a surface of the substrate 21 and electrically coupled to one or more of the posts 27.

Figure 5:
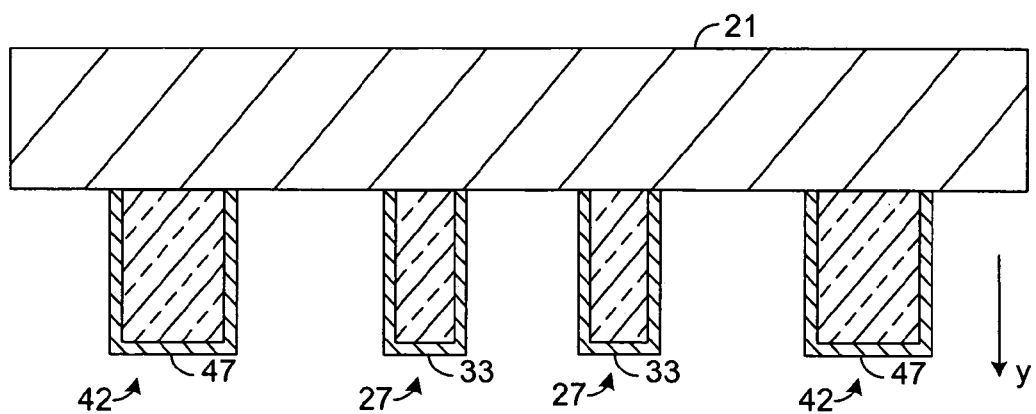
FIG. 5 is a cross-sectional view of the substrate depicted in FIG. 3 after an electrically conductive layer is formed on the posts and a hermetic layer is formed on the gasket of the substrate.

As depicted by FIG. 5 and block 54 of FIG. 2, each of the posts 27 is coated with a thin electrically conductive layer 33, and the gasket 42 is coated with a thin layer 47 that increases the hermeticity of the gasket 42. Various microfabrication techniques, such as sputtering, evaporation, chemical vapor deposition (CVD), or electroplating, may be used to form the layers 33 and 47. In one exemplary embodiment, to coat the posts 27 with layer 33, evaporation or sputtering is used to deposit a thin seed layer on the surface of the substrate 21, including the posts 27 and gasket 42. Then, electroplating is used to deposit a layer of electrically conductive material on the seed layer. Photolithography and etching are then used to remove the seed and electrically conductive layers from all portions of the substrate 21 except the posts 27. As a result, a layer 33 of electrically conductive material remains on the posts 27.

Further, to coat the gasket 42 with a layer 47 of gold, for example, evaporation or sputtering is used to deposit a thin seed layer on the surface of the substrate, including the posts 27 and gasket 42. Then, electroplating is used to deposit gold on the seed layer. Photolithography and etching are then used to remove the seed layer and the gold from all portions of the substrate 21 except the gasket 42. As a result, a layer 47 of gold remains on the gasket 42.

In other embodiments, other techniques may be used to form the posts 27 and gasket 42, and materials other than gold may be used to form the layer 47. If the layers 33 and 47 are composed of the same material, then these layers 33 and 47 may be formed simultaneously according to the techniques described above. In this regard, after using electroplating to deposit the material of layers 33 and 47 on the substrate 21, photolithography and etching are used to remove such material from all portions of the substrate 21 except the posts 27 and gasket 42.

In the exemplary embodiment depicted by FIG. 5, each of the posts 27 is completely coated with the material of the layer 33, and the gasket 42 is completely coated with the material of the layer 47. In other words, all exposed areas of the posts 27 depicted by FIG. 4 are covered with material of the layer 33, and all exposed areas of the gasket 42 depicted by FIG. 4 are covered with the material of the layer 47. However, in other embodiments, it is possible to only coat portions of the posts 27 and gasket 42 with the layers 33 and 47, respectively. Indeed, an exemplary embodiment will be described below in which only an outward-facing side surface of the gasket 42 is coated with the material of layer 47.

If circuits 39 are indeed located on the surface of the substrate 21, such circuits 39 may be covered with a dielectric layer or other type of insulating layer deposited on the substrate 21 before formation of the posts 27 and gasket 42. Such a layer will protect the circuits 39 from the processes used to form the posts 27 and gasket 42. To further protect such circuits when forming the posts 27 and gasket 42, processes that exceed acceptable temperature ranges for the circuits should be avoided.

Figure 6:
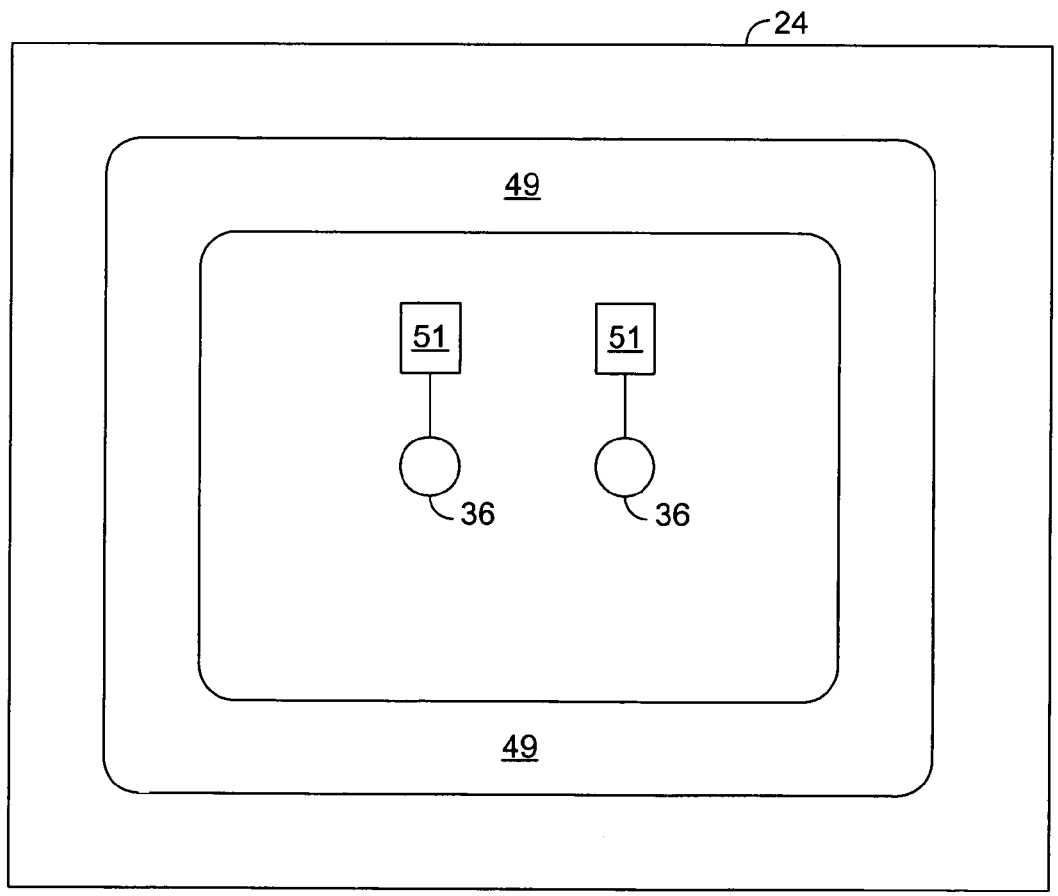
FIG. 6 is a top view of a substrate to be bonded to the substrate depicted by FIG. 5.

FIG. 6 depicts a top view of the substrate 24. The substrate 24 has pads 36 and 49 formed on its surface. As can be seen by comparing FIGS. 4 and 6, the shapes of the pads 36 and 49 in the plane parallel to the major surface of substrate 24 may be respectively the same as the cross-sectional shapes of the posts 27 and gasket 42 in the plane parallel to the major surfaces of substrate 21. However, it is possible for the pads 36 and 49 to have shapes different from the cross-sectional shapes of the posts 27 and gasket 42. Further, as shown by FIG. 6, circuits 51 may be formed on a surface of the substrate 24 and electrically coupled to one or more of the pads 36. In such an embodiment, the circuits 51 are electrically coupled to the circuits 39 (FIG. 4) of substrate 21 via one or more posts 27 once the substrates 21 and 24 are bonded together, as will be described in more detail hereafter.

As depicted by block 56 of FIG. 2, the substrates 21 and 24 are pressed together and bonded by bonding posts 27, gasket 42, and/or other components of substrate 21 to substrate 24. In particular, the substrates 21 and 24 are aligned and pressed together such that the posts 27 contact the pads 36 and gasket 42 contacts pad 49 of substrate 24. The compliance of the posts 27 relieves stresses that otherwise would be present in the posts 27 and, therefore, prevents the posts 27 from fracturing or otherwise failing as the substrates 21 and 24 are being pressed together. Also, pressing the substrates 21 and 24 together presses the gasket 42 against the pad 49 of substrate 24. The compliance of the gasket 42 enables the gasket 42 to deform as the substrates 21 and 24 are pressed together. The deformation of the gasket 42 relieves stresses that otherwise would be present in the gasket 42 and, therefore, prevents the gasket 42 from fracturing or otherwise failing as the substrates 21 and 24 are being pressed together. The substrates 21 and 24 are bonded while being pressed together. Various known or future-developed bonding techniques, such as eutectic-metal bonding, thermal compression, or gluing, may be used to bond substrates 21 and 24.

In one exemplary embodiment, a eutectic-metal bond is formed between the gasket 42 and pad 49. In particular, the layer 47 is composed of gold (Au). Further, a tin (Sn) layer is deposited on the pad 49. Then, the substrates 21 and 24 are pressed together and heated to a temperature that melts the tin causing the tin to diffuse with the gold layer 47. As a result, a gold-tin (Au—Sn) bond is formed between the pad 49 and the gasket 42. In other embodiments, other types of material may be used to form a eutectic-metal bond between components of the substrates 21 and 24, and other types of bonding techniques may be used to bond the substrates 21 and 24. Further, the substrates 21 and 24 may be bonded by bonding other components of the substrates 21 and 24, such as the posts 27 or other components not specifically shown in FIG. 1.

The compliance of the posts 27 and the gasket 42 allows each of the posts 27 and the gasket 42 to make intimate and uniform contact with the substrate 24 even if there are slight variations in the heights (measured in the y-direction) of these components or variations in the surface topology of substrate 21 or 24. For example, if imperfections in the microfabrication process cause one of the posts 27 or a portion of the gasket 42 to make contact with the substrate 24 prior to another of the posts 27 or another portion of the gasket 42, then the post 27 or gasket portion in contact with the substrate 24 will deform as the substrates 21 and 24 are pressed further together to establish contact between substrate 24 and all posts 27 and the entire periphery of the gasket 42.

Note that it is not necessary for the device 15 to include both an electrically conductive post 27 and a gasket 42. Gasket 42 may provide a hermetic seal between the substrates 21 and 24, as described above, without there being electrically conductive connections between the substrates 21 and 24. Further, it is possible to provide one or more electrical connections between the substrates 21 and 24 as described above without there being a gasket 42 between the substrates 21 and 24.

In addition, the layers 33 and 47 coating posts 27 and gasket 42, respectively, may have different thicknesses depending on the material and dimensions of the posts 27 and gasket 42. The gasket 42 and the posts 27 should be sufficiently compliant to enable these components to deform without fracturing or otherwise mechanically failing while being pressed against the substrate 24. The compliance of these components is generally provided by the compliant material to which the layers 33 and 47 are respectively coated. However, many types of materials that may be used to form layers 33 and 47, respectively, are substantially non-compliant. Thus, if the layers 33 and 47 are too thick, then the compliance of the posts 27 and the gasket 42 may be reduced to the extent that the posts 27 and gasket 42 are unable to adequately deform while being pressed against the substrate 24. If the layers 33 and 47 significantly reduce the compliance of the posts 27 and gasket 42, then a fracture or other mechanical failure of the posts 27 and gasket 42 may occur when the substrates 21 and 24 are pressed together. Further, a post 27 or gasket portion in one area of the device 15 may not sufficiently deform to allow another post 27 or the remainder of the gasket 42 to contact the substrate 24.

Thus, to avoid the problems just described, each electrically conductive layer 33 is made significantly thinner than its corresponding post 27. The layer 33 is made as thin as possible consistent with providing a low-resistance electrical connection between the substrates 21 and 24. Further, the problems are also avoided by making layer 47 significantly thinner than the gasket 42. The layer 47 is made as thin as possible consistent with providing a specified hermeticity for the chamber 44. For most polymer posts 27 and gaskets 42 having thicknesses on the order of 50 micro-meters (μm), approximately 3-5 μm thick electrically conductive and hermetic layers 33 and 47 typically achieve the foregoing. However, depending on the materials and dimensions of the posts 27 and gasket 42, as well as the material of the layers 33 and 47, a suitable thickness of the layers 33 and 47 may be outside of the range described above.

In some embodiments, the layer 47 is composed of electrically conductive material (e.g., the same material as layer 33) such that the gasket 42, in addition to providing a hermetic seal, also provides an electrical connection between the substrates 21 and 24. When the layer 47 is composed of electrically conductive material, the gasket 42 may also be used as an electrical shield for providing electrical isolation between components in the chamber 44 and components outside of the chamber 44.

In the embodiments described above, the posts 27 and the gasket 42 are both formed on substrate 21. However, it is possible for the posts 27 and the gasket 42 to be formed on different substrates, if desired. For example, posts 27 may be formed on substrate 21, as described above, and the gasket 42 may be formed on substrate 24 before the two substrates 21 and 24 are pressed together and bonded.

Figure 7:
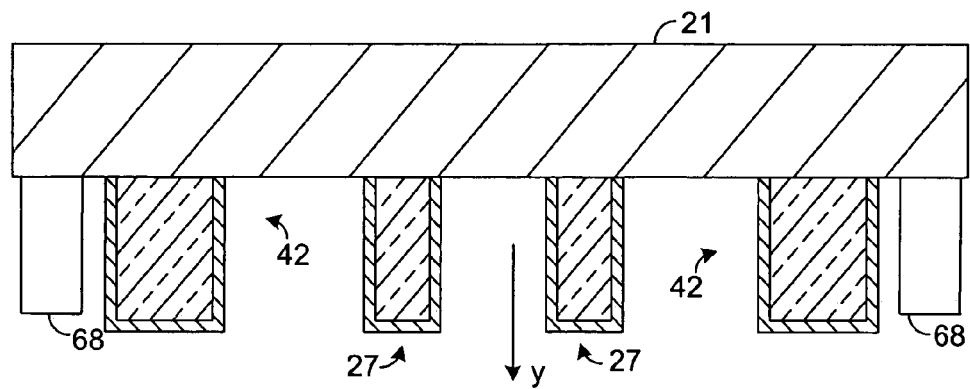
FIG. 7 is a cross-sectional view of the substrate depicted by FIG. 5 after spacers are formed on a surface of the substrate.
Figure 8:
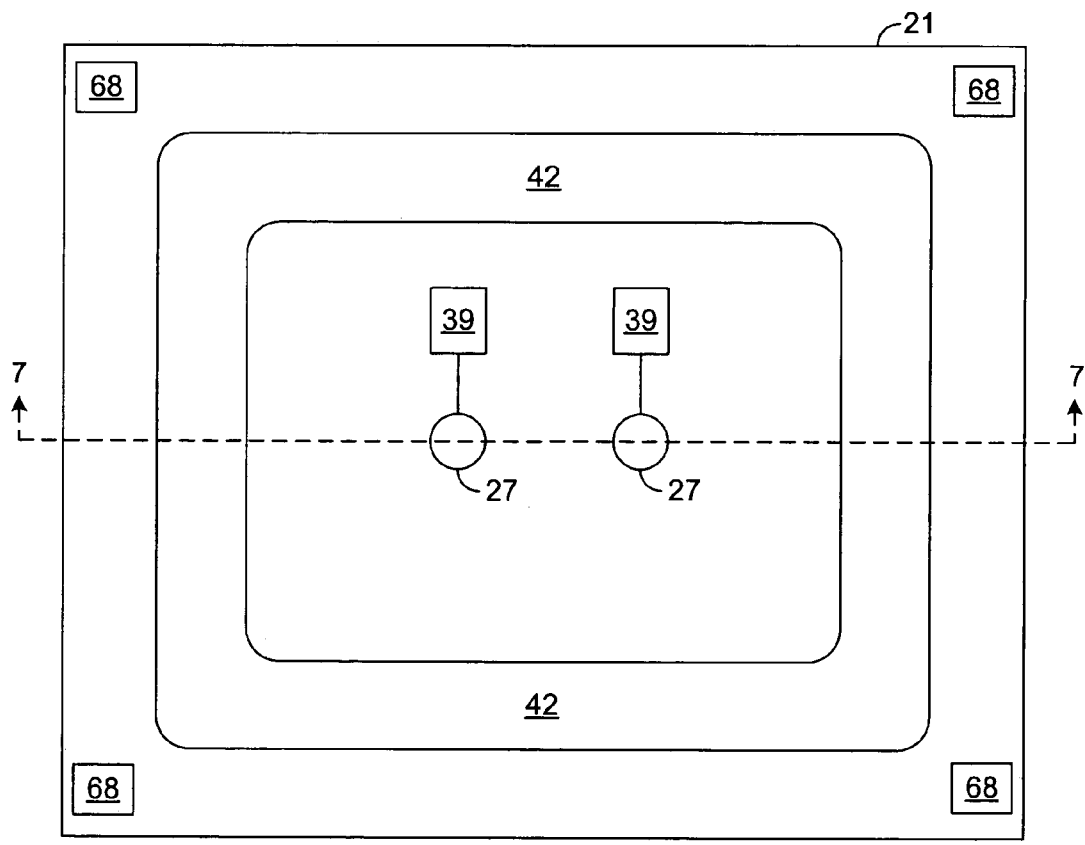
FIG. 8 is a bottom view of the substrate depicted in FIG. 7.

In addition, it is possible to use a non-compliant spacer to precisely control the separation distance between the substrates 21 and 24 and to control the formation of the compliant components 27 and 42 when the substrates 21 and 24 are pressed together. Such a spacer may be located on either substrate 21 or 24. For example, FIGS. 7 and 8 show an embodiment in which four non-compliant spacers 68 are formed on substrate 21. Other embodiments may have other numbers of spacers 68. Further, although each of the spacers 68 is located outside the periphery of the gasket 42 and, therefore, outside the chamber 44 in the example shown by FIGS. 7 and 8, it is possible for one or more of the spacers 68 to be located inside the gasket's periphery and, therefore, in the chamber 44 in other embodiments.

Figure 9:
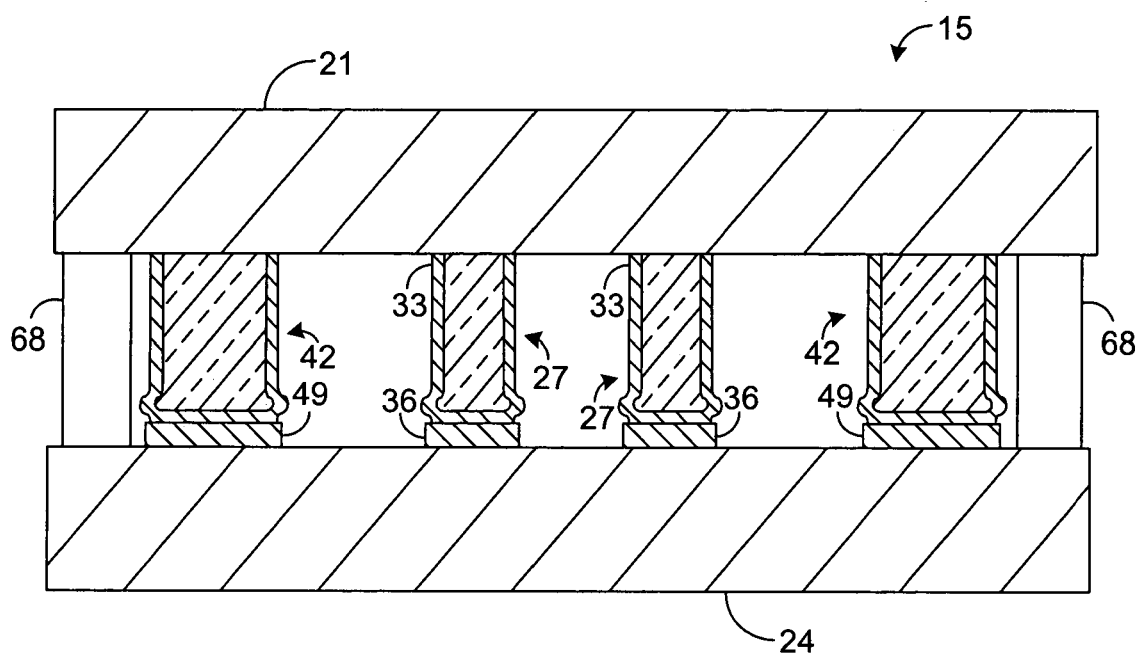
FIG. 9 is a cross-sectional view of the substrate of FIG. 7 bonded with another substrate.

Each of the spacers 68 of FIGS. 7 and 8 has the same height (measured in the y-direction), which is short enough to allow the substrate 24 to contact all of the posts 27 and gasket 42 under minimum tolerance conditions before contacting the spacers 68. Thus, as the substrates 21 and 24 are pressed closer together, the posts 27 and gasket 42 contact the substrate 24 and then deform, as described above. The spacers 68 are also short enough to allow the posts 27 and gasket 42 to sufficiently deform consistent with providing low-resistance connections between the substrates 21 and 24 and a specified hermeticity for the chamber 44, as described above. Once the substrate 24 contacts the spacers 68, as shown by FIG. 9, the spacers 68 prevent the substrates 21 and 24 from moving closer together. Thus, by bonding the substrates 21 and 24 in the position depicted by FIG. 9, the separation distance of the substrates 21 and 24 precisely matches the height of the spacers 68.

Figure 10:
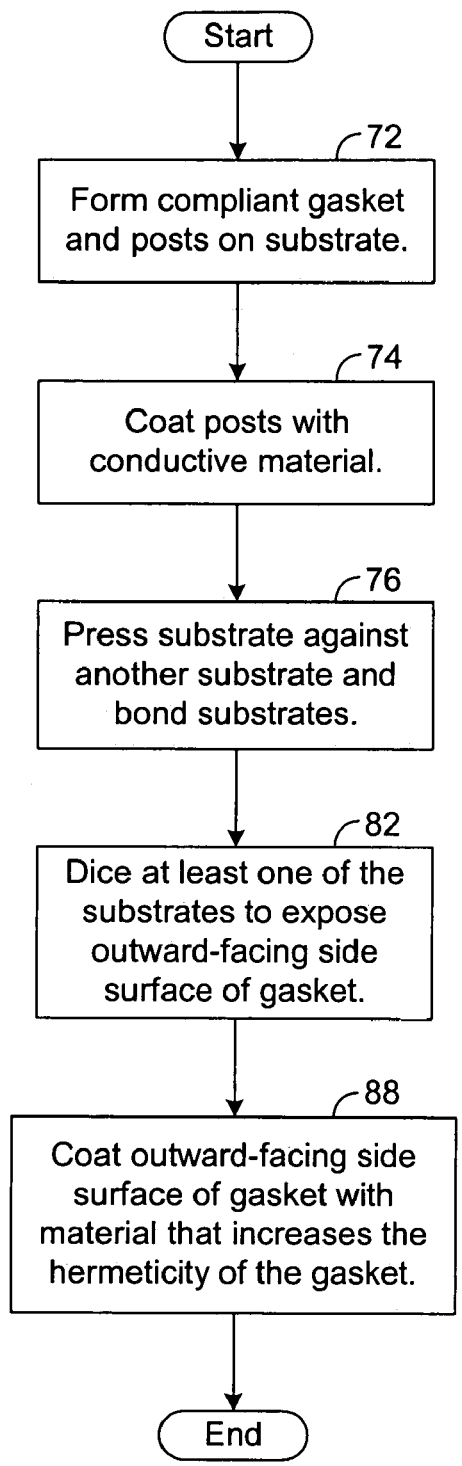
FIG. 10 is flow chart illustrating another exemplary method for manufacturing a device.

FIG. 10 depicts another exemplary method that may be used to form electrical connections and hermetic seals within devices manufactured in accordance with an embodiment of the present invention. In the method depicted by FIG. 10, the gasket 42 is coated with a layer 84 of a different material after the substrates 21 and 24 are bonded. As a result, the components (e.g., circuits 39 and 51) in the chamber 44 are not exposed and are, therefore, protected during the coating of the gasket 42.

Figure 11:
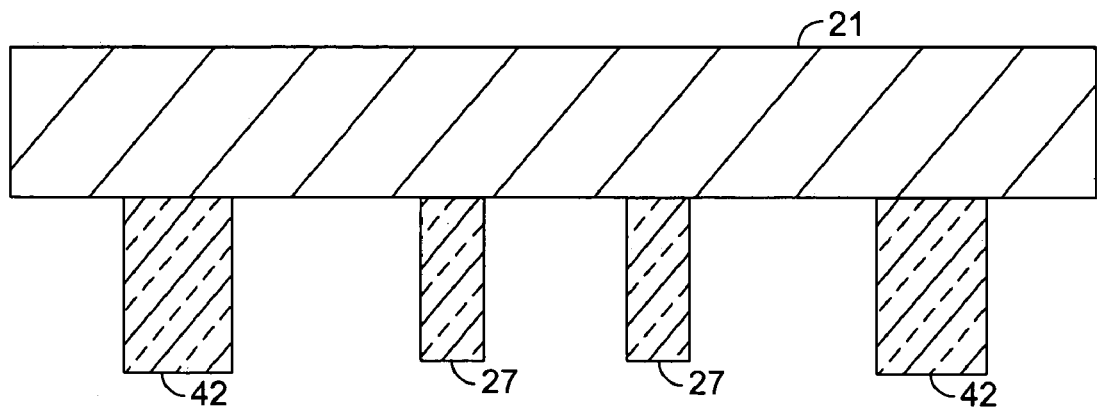
FIG. 11 is a cross-sectional view of a substrate having compliant posts and a compliant gasket formed on a surface of the substrate
Figure 12:
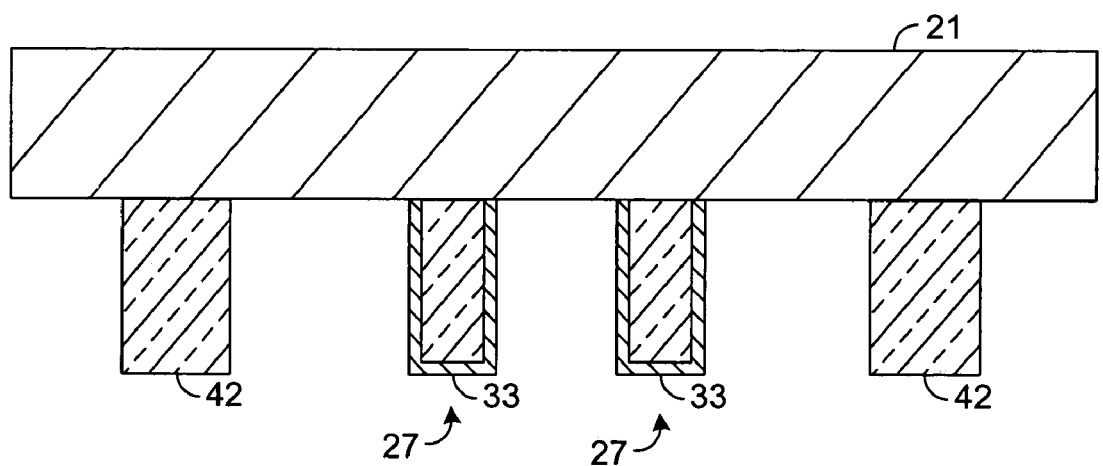
FIG. 12 is a cross-sectional view of the substrate depicted in FIG. 11 after an electrically conductive layer is formed on the posts of the substrate.
Figure 13:
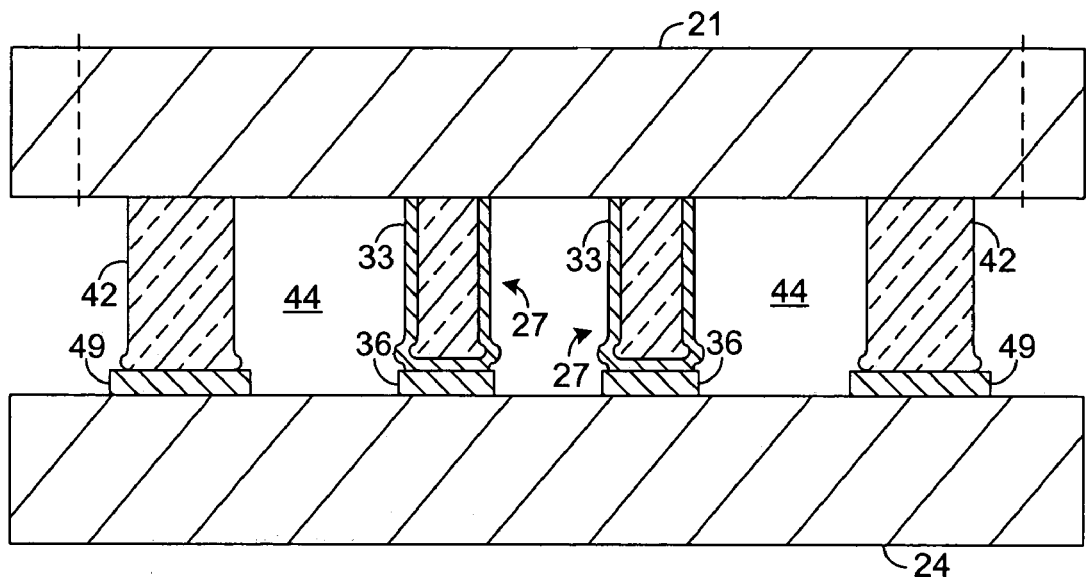
FIG. 13 is a cross-sectional view of the substrate depicted in FIG. 12 bonded with the substrate depicted in FIG. 6.

As depicted by FIG. 11 and block 72 of FIG. 10, posts 27 and gasket 42 are formed of a compliant material on the major surface of a substrate 21. Then, as depicted by FIG. 12 and block 74 of FIG. 10, each of the posts 27 is coated with a layer 33 of electrically conductive material. As depicted by FIG. 13 and block 76 of FIG. 10, the substrate 21 is then pressed against another substrate 24 and bonded. In particular, the substrates 21 and 24 are aligned and pressed together such that posts 27 contact pads 36 and gasket 42 contacts pad 49. The compliance of the posts 27 and the gasket 42 enables the posts 27 and the gasket 42 to deform as the substrates 21 and 24 are pressed together. Thus, for the reasons set forth above, the compliance of the posts 27 and the gasket 42 helps to ensure that the entire periphery of the gasket 42 and each of the posts 27 intimately and uniformly contact components (e.g., pads 36 and 49) of substrate 24 during the bonding process. As a result, the posts 27 form better electrical connections between the substrates 21 and 24, and the gasket 42 forms a better hermetic seal between the substrates 21 and 24.

Figure 14:
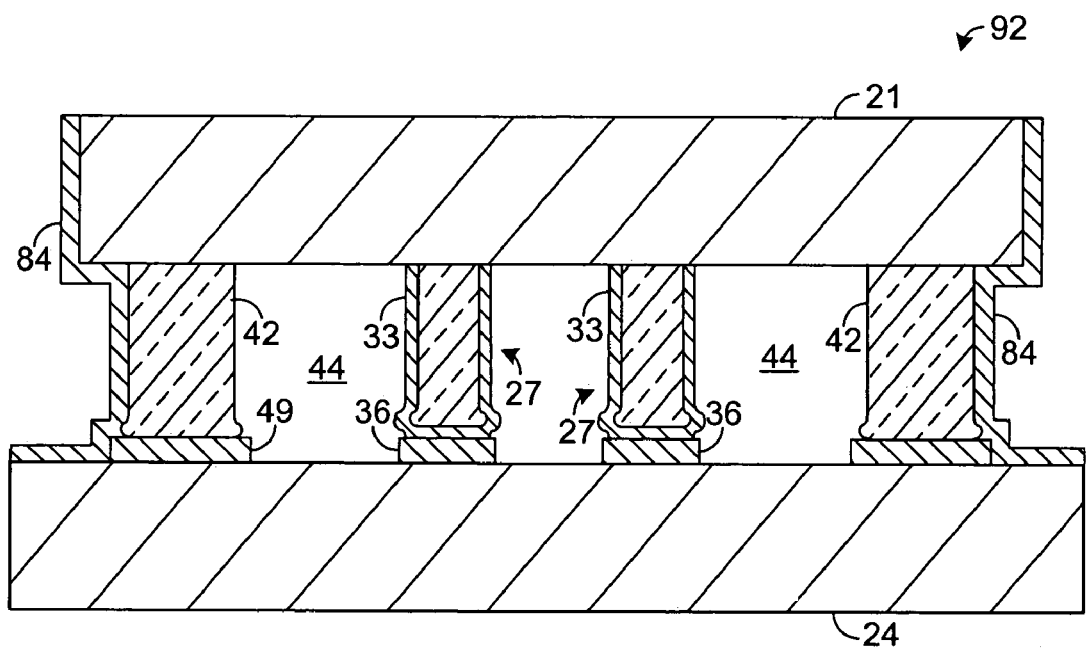
FIG. 14 is a cross-sectional view of the substrates depicted in FIG. 13 once a hermeticity-increasing layer is coated on an outward-facing side surface of a gasket residing between the substrates.

In batch fabrication, several thousand devices can be microfabricated at the same time using a single wafer as substrate 21 and a single wafer as substrate 24 for each of the devices. In such an embodiment, it is not likely that the gasket 42 of any one of the devices is accessible for coating until the substrate 21 is diced or a via (not shown) is formed extending through the thickness of the substrate 21. Thus, once the substrates 21 and 24 are bonded in block 76 of FIG. 10, the substrate 21 is diced along the dotted lines shown in FIG. 13 to provide access to the gasket 42, as depicted by block 82 of FIG. 10. Such access enables the gasket 42 to be coated with layer 84 using conventional microfabrication techniques, such as electroplating or chemical vapor deposition (CVD). Thus, after dicing the substrate 21 in block 82 of FIG. 10, the outward-facing side surface of the gasket 42 is coated with a layer 84 of a material (e.g., gold) that increases the hermeticity of the gasket 42, as shown by FIG. 14 and block 88 of FIG. 10. In the device 92 depicted by FIG. 14, each of the coated posts 27 provides an electrical connection between the substrates 21 and 24, and the coated gasket 42 provides a hermetic seal for the chamber 44.

Figure 15:
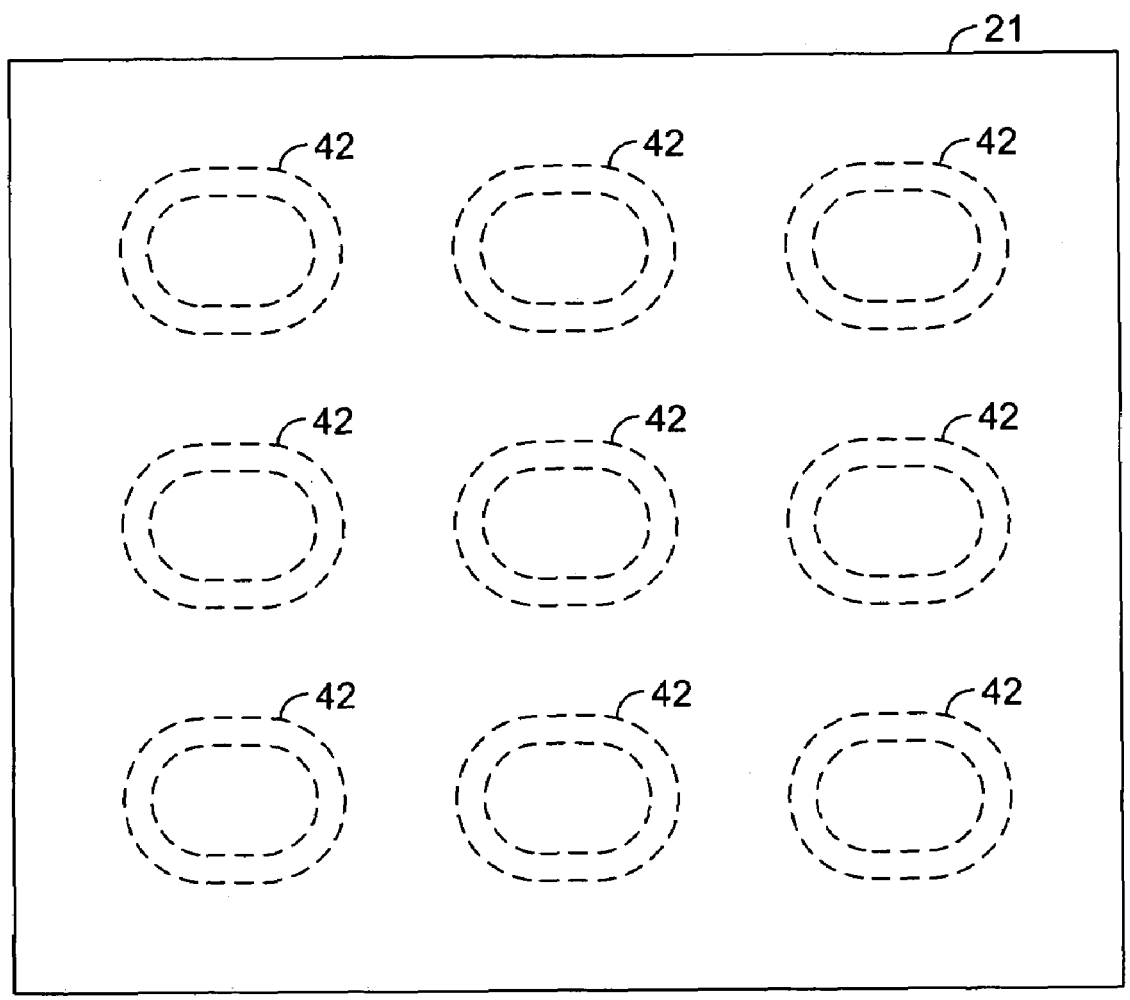
FIG. 15 is a top view of bonded substrates used during batch fabrication of multiple devices similar to the one depicted in FIG. 14.

To further illustrate the foregoing, refer to FIG. 15, which is a top view of substrate 21 after substrates 21 and 24 have been bonded in block 76 of FIG. 10. In the embodiment depicted by FIG. 15, nine gaskets 42 are located between the substrates 21 and 24 and are represented with dotted lines since they are, in reality, hidden from view. The gaskets 42 of FIG. 15 are not readily accessible for coating.

Figure 16:
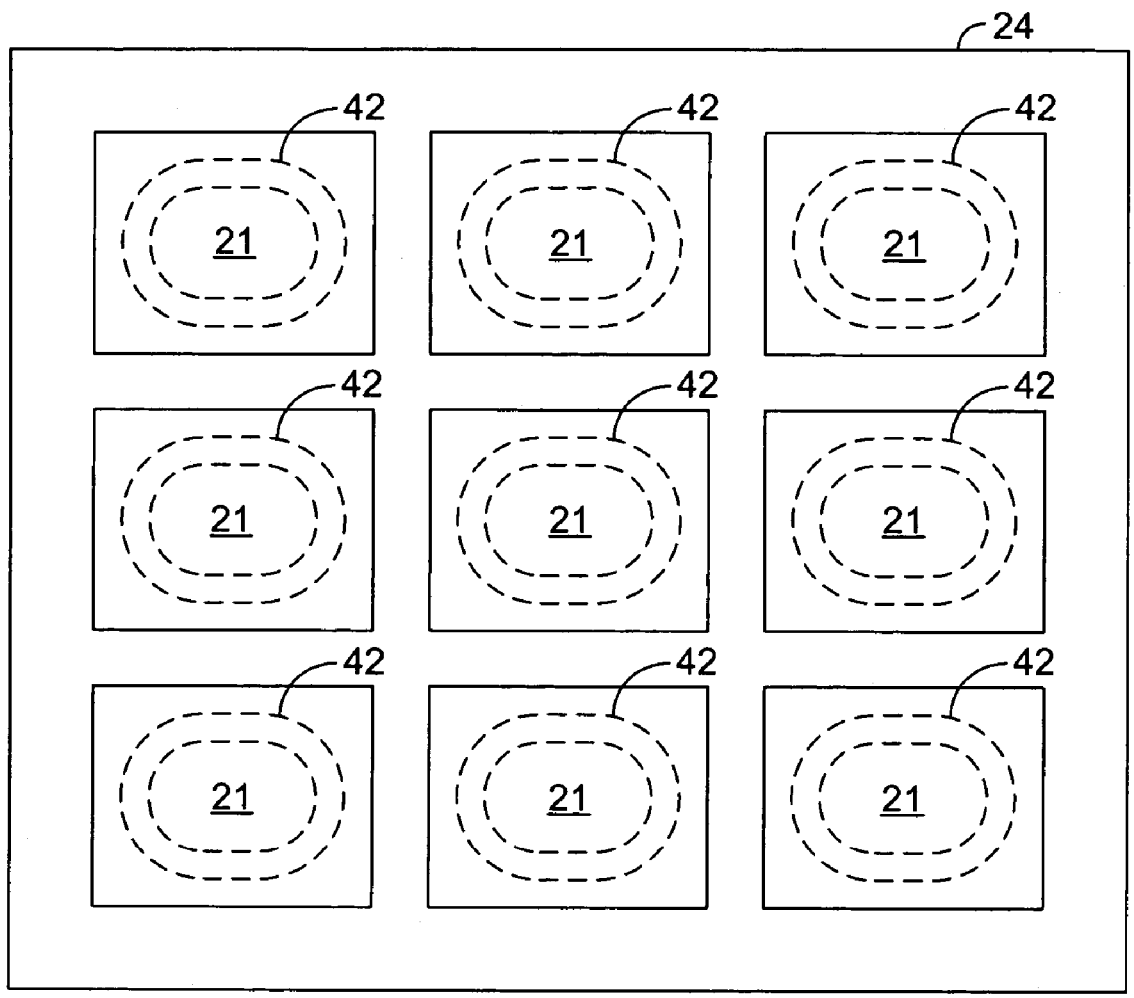
FIG. 16 is a top view of the substrates of FIG. 15 once the top substrate has been diced.

In block 82 of FIG. 10, the substrate 21 is diced as shown by FIG. 16. In this regard, portions of the substrate 21 between the gaskets 42 are removed. Therefore, while performing electroplating or CVD in block 88 of FIG. 10, material may pass between the remaining portions of substrate 21 and coat the outward-facing side surface of each of the gaskets 42. The substrate 24 may then be diced to form nine separate devices 92 depicted in FIG. 14. In an alternative embodiment, it is possible to provide access to the gasket 42 by dicing substrate 24, instead of substrate 21, in a similar manner.

I claim:

1. A device, comprising:
    a first substrate having an upper surface with a gasket formed thereon, said gasket being composed of a first compliant material and at least partially coated with a hermeticity-increasing material;
    a second substrate having an upper surface with at least one electrically conductive area thereon;
    wherein said first substrate and said second substrate are pressed together with said upper surface of said first substrate facing said upper surface of said second substrate, such that said gasket is deformed; and
    wherein said gasket and said upper surface of said second substrate form an enclosed chamber that is hermetically sealed, and wherein at least one electrically-conductive element is located within said enclosed chamber and is in direct contact with said at least one electrically conductive area on said second substrate.

2. The device of claim 1, wherein said electrically-conductive element is a post composed of a second compliant material and coated with an electrically-conductive material.

3. The device of claim 2, wherein at least one of said first compliant material and said second compliant material comprises a polymer.

4. The device of claim 2, wherein at least one of said first compliant material and said second compliant material comprises a polyimide.

5. The device of claim 1, wherein said hermeticity-increasing material is electrically conductive.

6. The device of claim 1, wherein said hermeticity-increasing material is not electrically conductive.

7. The device of claim 1, wherein said gasket has an inner surface and an outer surface, and wherein an outer surface of said gasket, a portion of said upper surface of said first substrate, and a portion of said upper surface of said second substrate are coated with said hermeticity-increasing material.

8. The device of claim 1, further comprising at least one non-compliant spacer formed on one of said first substrate and said second substrate.

9. A device, comprising:
 a first substrate having an upper surface with a gasket and at least one post formed thereon, said gasket being composed of a first compliant material and coated with a hermeticity-increasing material, and said at least one post being composed of a second compliant material and coated with an electrically-conductive material;
 a second substrate having an upper surface with at least one electrically conductive area thereon;
 wherein said first substrate and said second substrate are pressed together with said upper surface of said first substrate facing said upper surface of said second substrate, such that said gasket and said at least one post of said first substrate are deformed; and
 wherein said gasket and said upper surface of said second substrate form an enclosed chamber that is hermetically sealed, and said at least one post is positioned within said chamber and in direct contact with said at least one electrically conductive area on said second substrate.

10. The device of claim 9, wherein at least one of said first compliant material and said second compliant material comprises a polymer.

11. The device of claim 9, wherein at least one of said first compliant material and said second compliant material comprises a polyimide.

12. The device of claim 9, wherein said hermeticity-increasing material is electrically conductive.

13. The device of claim 9, wherein said hermeticity-increasing material is not electrically conductive.

14. The device of claim 9, further comprising at least one non-compliant spacer formed on one of said first substrate and said second substrate.

15. A device, comprising:
 a first substrate having an upper surface with a gasket and at least one post formed thereon, said gasket having an inner surface and an outer surface and being composed of a first compliant material, said at least one post being composed of a second compliant material and coated with an electrically-conductive material;
 a second substrate having an upper surface with at least one electrically conductive area formed thereon;
 wherein said first substrate and said second substrate are pressed together with said upper surface of said first substrate facing said upper surface of said second substrate, such that said gasket and said at feast one post of said first substrate are deformed; and
 wherein said outer surface of said gasket, a portion of said upper surface of said first substrate, and a portion of said upper surface of said second substrate are coated with a hermeticity-increasing material such that said inner surface of said gasket and said upper surface of said second substrate form an enclosed chamber that is hermetically sealed, and said at least one post is positioned within said enclosed chamber and in direct contact with said at least one electrically conductive area on said second substrate.

16. The device of claim 15, wherein at least one of said first compliant material and said second compliant material comprises a polymer.

17. The device of claim 15, wherein at least one of said first compliant material and said second compliant material comprises a polyimide.

18. The device of claim 15, wherein said hermeticity-increasing material is electrically conductive.

19. The device of claim 15, wherein said hermeticity-increasing material is not electrically conductive.

20. The device of claim 15, further comprising at least one non-compliant spacer formed on one of said first substrate and said second substrate.

* * * * *

UNITED STATES PATENT AND TRADEMARK OFFICE
CERTIFICATE OF CORRECTION

PATENT NO. : 7,294,919 B2 Page 1 of 1
APPLICATION NO. : 10/723095
DATED : November 13, 2007
INVENTOR(S) : Qing Bai It is certified that error appears in the above-identified patent and that said Letters Patent is hereby corrected as shown below:

First Page, Column 1 (Title), Line 1, delete "COMPLAINT" and insert -- COMPLIANT --;

Column 1 (Title), Line 1, delete "COMPLAINT" and insert -- COMPLIANT --;

Column 10, Line 13, Claim 15, delete "feast" and insert -- least --.

Signed and Sealed this

Eighth Day of June, 2010

David J. Kappos
*Director of the United States Patent and Trademark Office*